(12) United States Patent
Berkel et al.

(10) Patent No.: US 10,499,500 B2
(45) Date of Patent: Dec. 3, 2019

(54) CIRCUIT BOARD WITH EMBEDDED METAL PALLET AND A METHOD OF FABRICATING THE CIRCUIT BOARD

(71) Applicant: Flex Ltd.

(72) Inventors: J H Berkel, BR Rijssen (NL); Todd Robinson, San Mateo, CA (US); Joan K. Vrtis, Mesa, AZ (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/803,527

(22) Filed: Nov. 3, 2017

(65) Prior Publication Data

US 2018/0132348 A1    May 10, 2018

Related U.S. Application Data

(60) Provisional application No. 62/417,636, filed on Nov. 4, 2016.

(51) Int. Cl.
*H05K 1/02* (2006.01)
*H05K 3/02* (2006.01)
(Continued)

(52) U.S. Cl.
CPC ........... *H05K 1/0298* (2013.01); *H05K 1/021* (2013.01); *H05K 3/022* (2013.01); *H05K 3/4644* (2013.01); *H05K 3/4697* (2013.01); *H05K 3/0061* (2013.01); *H05K 3/4611* (2013.01); *H05K 2201/10416* (2013.01)

(58) Field of Classification Search
CPC .......... H05K 1/02; H05K 3/02; H05K 3/4462; H05K 3/0062; H05K 3/30

USPC ............... 361/700–710, 760–774, 803, 813; 174/252–264
See application file for complete search history.

(56) References Cited

U.S. PATENT DOCUMENTS 4,630,172 A * 12/1986 Stenerson ........... H01L 21/4857
257/713
5,159,750 A * 11/1992 Dutta .................... H01L 23/047
174/538

(Continued)

OTHER PUBLICATIONS

Non-Final Office Action, dated May 25, 2018, U.S. Appl. No. 15/816,971, filed Nov. 17, 2017, Applicant: Michael James Glickman, Examiner:Smith, Maurice C., art unit: 2877, 15 pages.

(Continued)

*Primary Examiner* — Tuan T Dinh
(74) *Attorney, Agent, or Firm* — Haverstock & Owens LLP

(57) ABSTRACT

A metal pallet is integrated within a circuit board using a process similar to a multilayer PCB, which integrates the metal pallet into the circuit board at the same time as the supporting layers are fabricated. The use of B-stage material provides a bonding mechanism for the metal pallet to be embedded within the circuit board, creating a cohesive integrated part. Embedding the pallet during the fabrication process, pre-lamination, generates a more robust construction and connection not impacted by post fabrication process in assembly. After assembly the circuit board with embedded metal pallet can be mounted directly on a heat sink, cool ribbon or other feature required to help remove heat. The planar back side surface provides a more robust mounting of the metal pallet than a post fabricated assembly as used in conventional techniques.

17 Claims, 13 Drawing Sheets

(51) Int. Cl.
  *H05K 3/46* (2006.01)
  *H05K 3/00* (2006.01)

(56) References Cited

U.S. PATENT DOCUMENTS

| | | | | |
|---|---|---|---|---|
| 5,459,639 | A * | 10/1995 | Izumi | H01L 23/427 |
| | | | | 174/252 |
| 6,459,493 | B1 | 10/2002 | Sugiura | |
| 6,541,712 | B1 | 4/2003 | Gately | |
| 7,281,328 | B2 | 10/2007 | Lee | |
| 8,222,537 | B2 | 7/2012 | Dudnikov | |
| 8,302,301 | B2 | 11/2012 | Lau | |
| 8,519,270 | B2 | 8/2013 | Chang | |
| 9,549,468 | B1 | 1/2017 | Tsai et al. | |
| 9,554,465 | B1 | 1/2017 | Liu | |
| 2001/0010303 | A1 * | 8/2001 | Caron | H05K 3/4691 |
| | | | | 216/18 |
| 2003/0007161 | A1 | 1/2003 | Bowles | |
| 2003/0020905 | A1 | 1/2003 | Savareigo | |
| 2003/0170553 | A1 | 9/2003 | Eberlein | |
| 2004/0130730 | A1 | 7/2004 | Cantin | |
| 2006/0017936 | A1 | 1/2006 | Cantin | |
| 2006/0181715 | A1 | 8/2006 | Bristow | |
| 2008/0217708 | A1 | 9/2008 | Reisner | |
| 2008/0285910 | A1 * | 11/2008 | Yamada | G02B 6/12002 |
| | | | | 385/14 |
| 2011/0135248 | A1 | 6/2011 | Langer | |
| 2012/0024575 | A1 * | 2/2012 | Zhang | H01L 23/3677 |
| | | | | 174/252 |
| 2012/0234587 | A1 | 9/2012 | Nakamura | |
| 2012/0305775 | A1 | 12/2012 | Krolak | |
| 2014/0092379 | A1 | 4/2014 | Niiranen | |
| 2014/0185060 | A1 | 7/2014 | Doerband | |
| 2014/0192346 | A1 | 7/2014 | Vandervalk | |
| 2014/0355006 | A1 | 12/2014 | Hotta | |
| 2014/0355009 | A1 | 12/2014 | Lin | |
| 2016/0013152 | A1 | 1/2016 | Yu et al. | |
| 2016/0021762 | A1 | 1/2016 | Kallman | |
| 2016/0093540 | A1 | 3/2016 | Liu | |
| 2016/0324004 | A1 * | 11/2016 | Schwarz | H05K 1/185 |
| 2016/0324012 | A1 * | 11/2016 | Qiu | H05K 3/4691 |
| 2017/0131701 | A1 | 5/2017 | Nelson | |

OTHER PUBLICATIONS

Non-Final Office Action dated Sep. 4, 2018, U.S. Appl. No. 15/064,437, filed Mar. 8, 2016, applicant: JL Zhou, Examiner: Patel; Ishwarbhai B., Art Unit: 2847, 14 pages.

Final Office Action dated Feb. 28, 2019, U.S. Appl. No. 15/064,437, filed Mar. 8, 2016, applicant: JL Zhou, examiner: Patel; Ishwarbhai B., art unit: 2471, 22 pages.

* cited by examiner

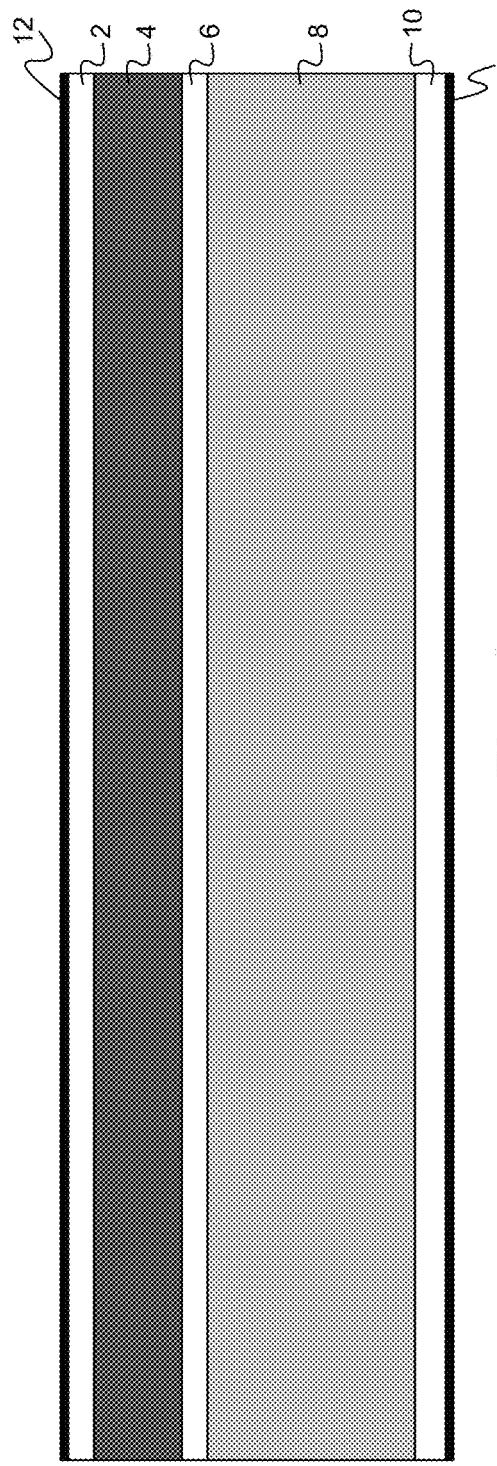
Fig. 1
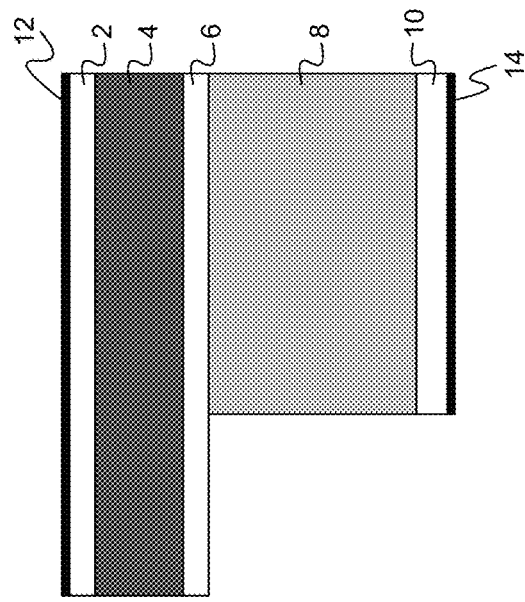
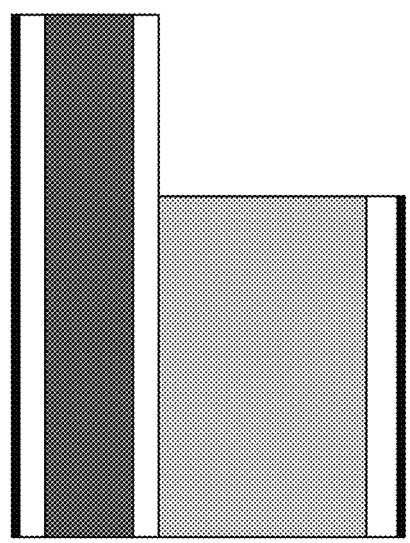
Fig. 2

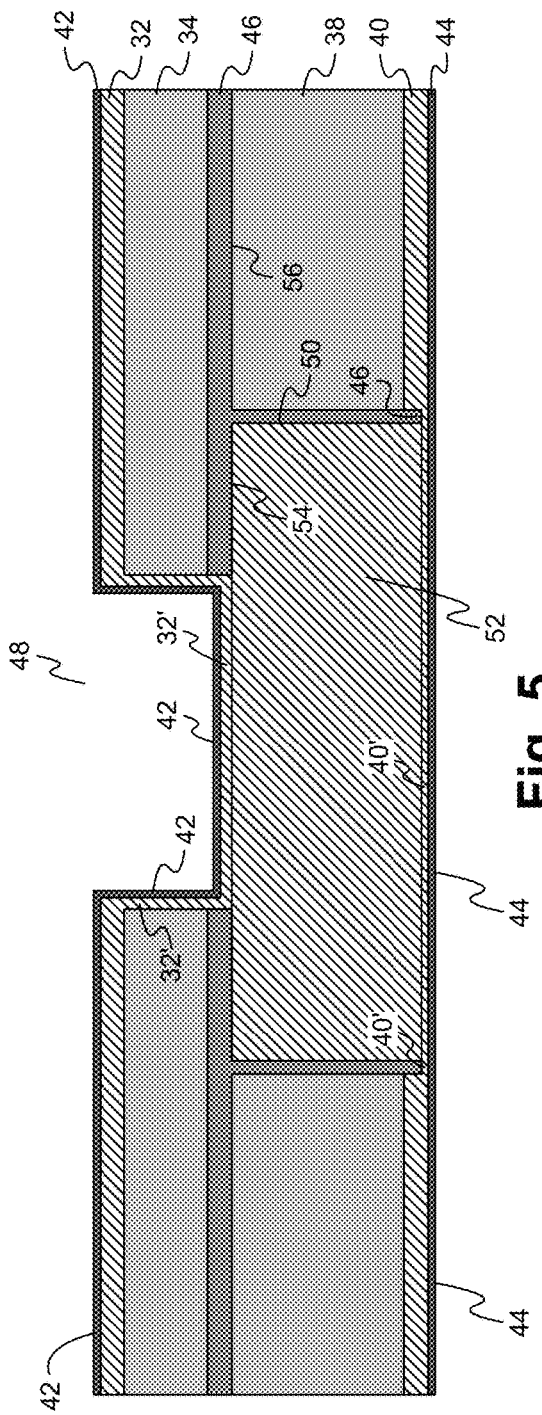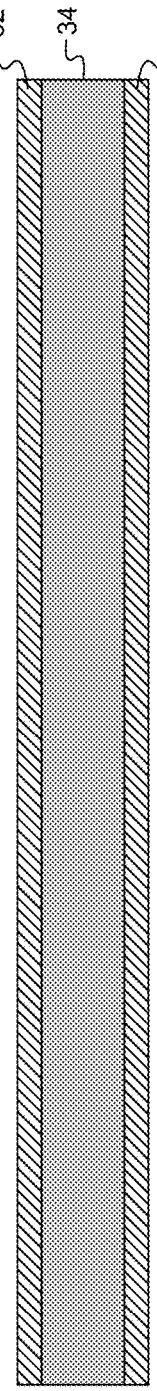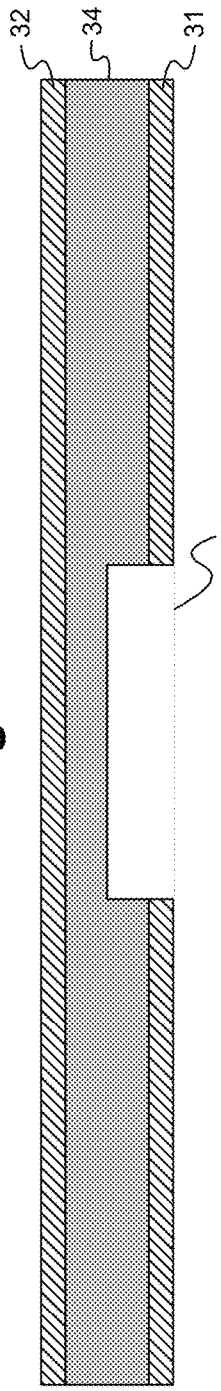

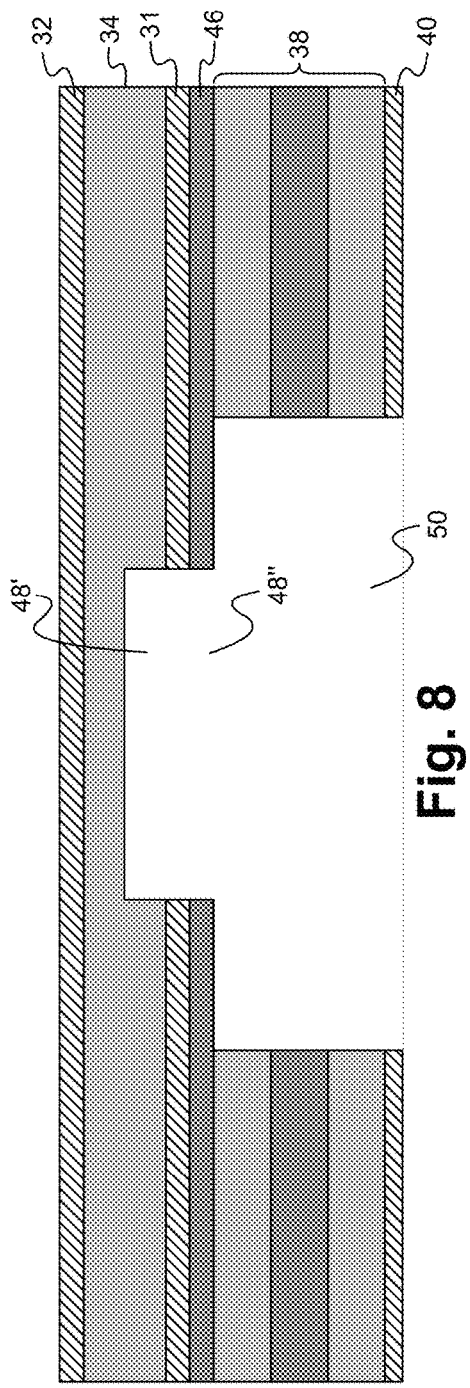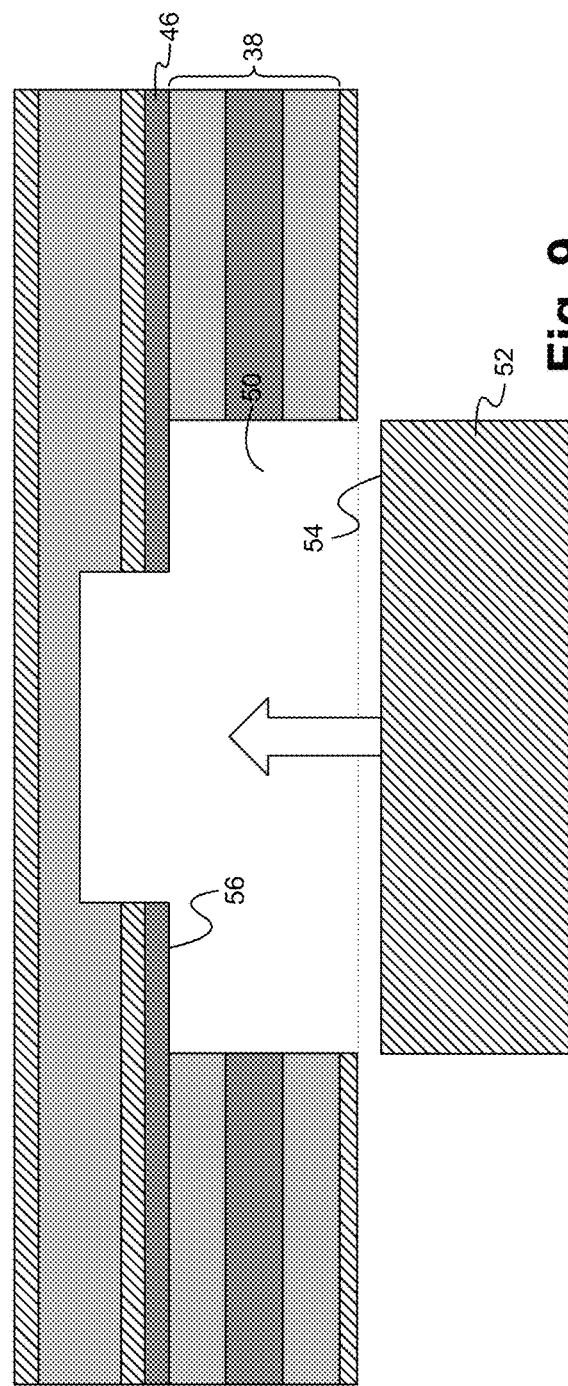

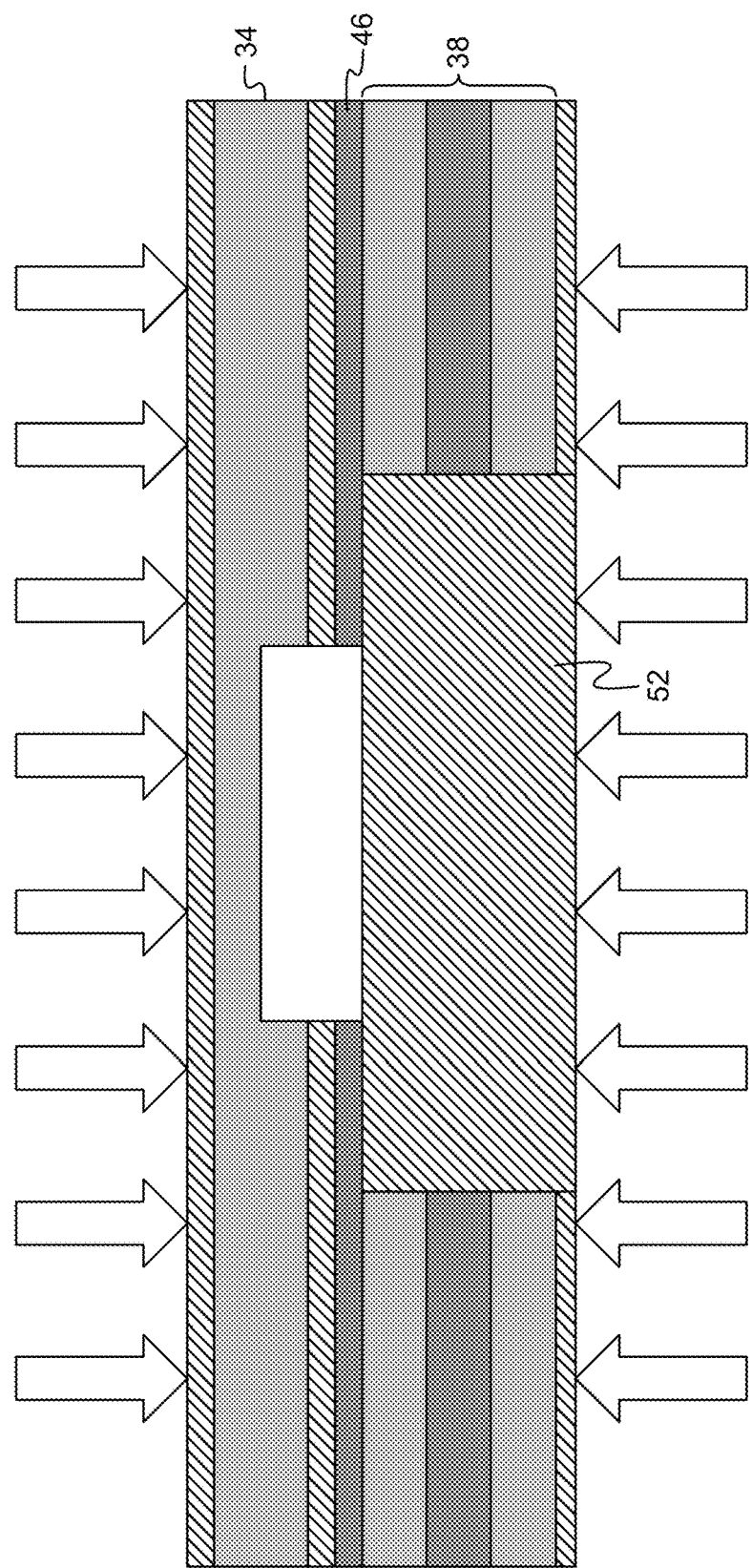

CIRCUIT BOARD WITH EMBEDDED METAL PALLET AND A METHOD OF FABRICATING THE CIRCUIT BOARD

RELATED APPLICATIONS

This Patent Application claims priority under 35 U.S.C. 119(e) of the U.S. Provisional Patent Application, Application No. 62/417,636, filed on Nov. 4, 2016, and entitled "RF ENERGY DEVICE EMBEDDED COPPER PALLET," which is hereby incorporated by reference in its entirety.

FIELD OF THE INVENTION

The present invention is generally directed to embedded heat conductive pallets. More specifically, the present invention is directed to heat conductive pallets embedded within a circuit board and connected to a heat generating electronic device.

BACKGROUND OF THE INVENTION

Conventional power amplifier boards are traditionally built as heavy or thick metal backed printed circuit boards (PCBs) called a brick or pallet board. The metal consists of a variety of alloys, most commonly used is copper and aluminum. The metal is formed as a metal block which is attached to a back side of the PCB. Typically, the PCB is mechanically mounted to the metal block with screws, solder, or adhesive bonding, although alternative methods, such as sweat soldering, can also used. This is a labor intensive process.

The width and length of the metal block match that of the PCB. The metal is used to dissipate heat and provide electrical grounding. A PCB typically includes one or more heat generating components, such as driver components, amplifier transistors, power circuits, circulators, and the like. Certain electronic components generate a large amount of heat. The heat generated by such a component is pulled away from the component and dissipated across the metal block. The metal block is in turn attached to a secondary heat sink to further dissipate the heat. Copper is the most commonly used material for the metal block due to its high thermal conductivity. Aluminum can be used to reduce weight and allow better handling, however, the thermal conductivity is not as good as copper.

Critical to efficient heat transfer from the heat generating components to the metal block is proper contact between the PCB and the metal block. However, contact of the PCB back side plane to the metal block can be compromised. For example, heat may cause warping of either the PCB or the metal block, the contact surfaces may oxidize over time, the PCB is only mechanically tied to the metal block through the mounting screws, there is no localized connection to help with isolated surface heat, and only the heat generating device of the PCB is physically contacting the metal block.

Additionally, the above assembly requires manual placement of the PCB onto the metal block after components have been mounted onto the PCB and mostly requires special tooling. Further, the above assembly includes extra assembly processes and handling that could jeopardize the finished product. Examples of such extra assembly processes and handling include mounting that can be jeopardized by pre-assembly processes, oxidation or surface contamination that can effect the efficiencies of the copper backing, tolerance controls for copper backing that can impact contact with the device mitigating the thermal performance, milling of the backing that increases the cost of final assembly, and isolated contact made through the mounting screws.

The metal block of this type is often excessive in size and is not suitable for mass production. Other techniques are used to more selectively position smaller sized metal blocks within the PCB substrate, such metal blocks commonly referred to as metal coins or pallets. Embedding such metal coins is a post-lamination process. First the PCB is formed, then a coin cavity is formed in the back side of the laminated PCB. A thermally conductive adhesive sheet, bonding film, or solder is applied within the coin cavity and the metal coin is positioned within the coin cavity. The soldering process requires a process with tight controls, incurs extra cost in tooling, and special tooling is required. The use of solder may result in long term reliability issues related to entrapped flux or solder voiding. The soldering process has to be executed at elevated temperatures and deformation of the PCB or metal coin can happen at these higher temperatures. Adhesives are not as problematic as solder, but adhesives are costly, can react poorly to additional elevated thermal cycles seen in assembly, and can lead to long term reliability issues if the bond is compromised.

The assembly is typically mounted to a heat sink for heat transfer from the embedded coin. Critical to efficient heat transfer is a planar surface on the back side of the PCB. The depth of the coin cavity and the thickness of the adhesive or solder must be finely regulated so that a bottom surface of the metal coin is co-planar with the back side surface of the PCB. This is difficult to consistently achieve. A common result is an uneven disposition of the coin bottom surface and the back side surface of the PCB.

FIGS. 1-4 illustrate an exemplary fabrication process for embedding a coin in a PCB according to conventional process and resulting structure. First a laminated stack is formed. FIG. 1 illustrates a cut out side view of an exemplary laminated stack. The laminated stack includes one or more top layers 4, one or more bottom layers 8 and intervening conductive layer 6. The laminated stack also includes outer conductive layer 2 and outer conductive layer 10. The top layers 4 and the bottom layers 8 can each represent a single non-conductive layer, such as a dielectric, or a multi-layer stack made of one or more conductive layers and one or more non-conductive layers. The conductive layers are each electrically conductive layers made of a metal, such as copper, that is patterned into electrically conductive traces, or interconnects. The outer conductive layers are often plated, such as with copper plating, and finish plated with an inert metal, such as gold, to prevent oxidation. The outer conductive layers and finish plating are etched after the lamination step. Vias can be formed to interconnect one or more of the conductive layers. The number of layers may vary depending on the application.

Once the laminated stack is formed, cutouts are made to receive the heat generating device and the metal coin. FIG. 2 illustrates a cut out side view of the laminated stack from FIG. 1 with cutouts. Device cutout 16 is formed in the front side of the laminated stack, through layers 2, 4, 6, and 12. Device cutout 16 is sized to receive a heat generating component. Coin cutout 18 is formed in the back side of the laminated stack, through 8, 10, and 14. Coin cutout 18 is sized to receive a metal coin.

The metal coin is secured in the coin cavity 18 by an adhesive. FIG. 3 illustrates a cut out side view of the laminated stack of FIG. 2 with an adhesive 20 added within the coin cutout 18. The adhesive 20 is positioned on the exposed surface of the conductive layer 6. A metal coin 22 is then inserted in the coin cutout 18, as shown in FIG. 4. A top surface 26 of the metal coin 22 contacts the adhesive 20. The adhesive 20 can be a thermally conductive adhesive but can also be a non-conductive type, and in addition to securing the metal coin 22 in position within the coin cutout 18, the adhesive 20 functions as a thermal interface material between the metal coin 22 and the conductive layer 6.

The assembly shown in FIG. 4 is typically attached to an external heat sink. To maximize heat transfer from the assembly to the heat sink, a planar bottom surface of the assembly is desired. However, due to the imprecise nature of forming the coin cutout 18 and applying a thickness of the adhesive 20, a bottom surface 24 of the metal coin 22 is often not co-planar with a bottom surface 28 of the laminated stack, as shown in FIG. 4. In general, the metal coin does not fit perfectly within the cavity. This results in both lateral gaps between the metal coin 22 and bottom layers 8. This also results in the metal coin either extending outward from the PCB backside surface or recessed within the coin cutout. In either case, a thermal interface material (TIM) is applied to compensate for the backside surface irregularities resulting in areas having greater TIM thickness than others. Unfortunately, TIM is not as thermally conductive as the material of the metal coin and outer bottom conductive layer, such as copper, and the areas of greater TIM thickness due to non-planar back side surfaces results in decreased thermal transfer efficiency.

SUMMARY OF THE INVENTION

A metal pallet is integrated within a circuit board using a process similar to a multilayer PCB, which integrates the metal pallet into the circuit board at the same time as the supporting layers are fabricated. The use of B-stage material provides a bonding mechanism for the metal pallet to be embedded within the circuit board, creating a cohesive integrated part. Embedding the pallet during the fabrication process, pre-lamination, generates a more robust construction and connection not impacted by post fabrication process in assembly. After assembly the circuit board with embedded metal pallet can be mounted directly on a heat sink, cool ribbon, or other feature required to help remove heat. The planar back side surface provides a more robust mounting of the metal pallet than a post fabricated assembly as used in conventional techniques.

In an aspect, a circuit board is disclosed. The circuit board includes a laminated stack of circuit board layers, a pallet cutout formed in the laminated stack, a metall pallet positioned within the pallet cutout, and a device cutout formed in the laminated stack. The laminated stack of circuit board layers has a first outer surface and a second outer surface opposite the first outer surface. The laminated stack of circuit board layers comprises a plurality of conductive layer and a plurality of non-conductive layers, one of the plurality of non-conductive layers is a bonding layer within an interior of the laminated stack, the bonding layer having a first surface and a second surface opposite the first surface. The pallet cutout is formed in the laminated stack from the second outer surface to the second surface of the bonding layer, the pallet cutout defined by side wall surfaces and the second surface of the bonding layer. The metal pallet has a first surface and a second surface opposite the first surface, wherein the first surface of the metal pallet is in contact with and is bonded to the second surface of the bonding layer. The device cutout is formed in the laminated stack from the first outer surface through the bonding layer to the first surface of the metal pallet. In some embodiments, the bonding layer comprises B-stage prepreg. In some embodiments, the pallet cutout is formed in a first portion of the laminated stack, further wherein the metal pallet further comprises side surfaces and the side wall surfaces of the pallet cutout are defined by the first portion of the laminated stack, and the side surfaces of the metal pallet are bonded to the side wall surfaces of the pallet cutout by resin flow from the B-stage prepreg. In some embodiments, the pallet cutout is formed in a first portion of the laminated stack, and the first portion of the laminated stack comprises one or more prepreg layers, further wherein the metal pallet further comprises side surfaces and the side wall surfaces of the metal pallet are defined by the first portion of the laminated stack, and the side surfaces of the metal pallet are bonded to the side wall surfaces of the pallet cutout by resin flow from the one or more prepreg layers. In some embodiments, the second outer surface of the laminated stack and the second surface of the metal pallet are co-planar to form a planar back side surface of the circuit board. In some embodiments, the circuit board further comprises a plating layer coupled to the back side surface of the circuit board to form a continuous planar surface across the back side of the circuit board that is interconnected to the metal pallet. In some embodiments, the device cutout is sized to receive a heat generating device. In some embodiments, the circuit board further comprises a plating layer selectively coupled to the first outer surface of the laminated stack, wherein the plating layer is further coupled to side wall surfaces of the device cutout and the first surface of the metal pallet. In some embodiments, the plating layer forms an interconnect between the metal pallet and any conductive layers in the laminated stack that intersect the side wall surfaces of the device cutout. In some embodiments, a portion of the plating on the side wall surfaces of the device cutout are selectively removed such that a remaining portion of the plating on the side wall surfaces of the device cutout forms an interconnect between the metal pallet and any conductive layers in the laminated stack that intersect the side wall surfaces of the device cutout coincident with the remaining portion of the plating.

In another aspect, a method of fabricating a circuit board with an embedded metal pallet is disclosed. The method includes stacking layers of a circuit board, wherein the layers comprise a plurality of conductive layer and a plurality of non-conductive layers. One of the plurality of non-conductive layers is a bonding layer within an interior of the stacked layers. A first portion of the stacked layers has a pallet cutout section, and the pallet cutout section of each layer in the first portion are aligned to form a pallet cutout for receiving a metal pallet. The bonding layer forms a bottom surface of the pallet cutout. The method also includes inserting the metal pallet into the pallet cutout such that a first surface of the metal pallet contacts the bonding layer. The method also includes laminating the stacked layers with inserted metal pallet to form a laminated stack and to bond the metal pallet to the bonding layer. In some embodiments, the bonding layer comprises B-stage prepreg. In some embodiments, laminating the stacked layers comprises applying heat and pressure to the stacked layers such that resin flows around sides of the metal pallet to bond the sides of the metal pallet to the first portion of the stacked layers. In some embodiments, laminating the stacked layers comprises compressing the stacked layers and the inserted metal pallet to form a planar back side surface of the circuit board where a bottom surface of the metal pallet is co-planar with a back side surface of the stacked layers. In some embodiments, the method also includes removing a second portion of the laminated stacked layers stacked over the metal pallet to form a device cutout that extends from a front side of the circuit board to the metal pallet, wherein the first surface of the metal pallet forms a bottom surface of the device cutout. In some embodiments, the device cutout is sized to receive a heat generating device. In some embodiments, the method also includes plating the front side of the circuit board which includes plating side wall surfaces of the device cutout and the first surface of the metal pallet exposed within the device cavity. In some embodiments, plating the side wall surfaces of the device cutout forms an interconnect between the metal pallet and any conductive layers intersecting the side wall surfaces of the device cutout. In some embodiments, the method also includes selectively removing a portion of the side wall plating on the side wall surfaces of the device cutout to selectively disconnect one or more of the conductive layers intersecting the side wall surfaces of the device cutout from the metal pallet. In some embodiments, the method also includes plating the back side of the circuit board to form a continuous planar surface across the back side of the circuit board that is interconnected to the metal pallet.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIGS. 1-4 illustrate an exemplary fabrication process for embedding a coin in a PCB according to conventional process and resulting structure.

FIG. 5 illustrates a cut out side view of a circuit board with embedded metal pallet according to some embodiments.

FIGS. 6-15 illustrate a method of fabricating a circuit board with embedded metal pallet according to some embodiments.

DETAILED DESCRIPTION OF THE EMBODIMENTS

Figure 3:
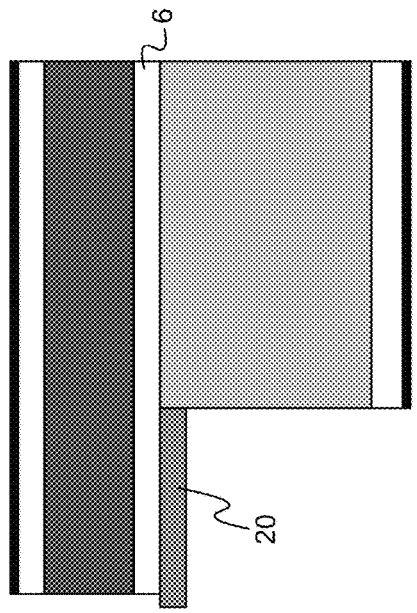
Figure 4:
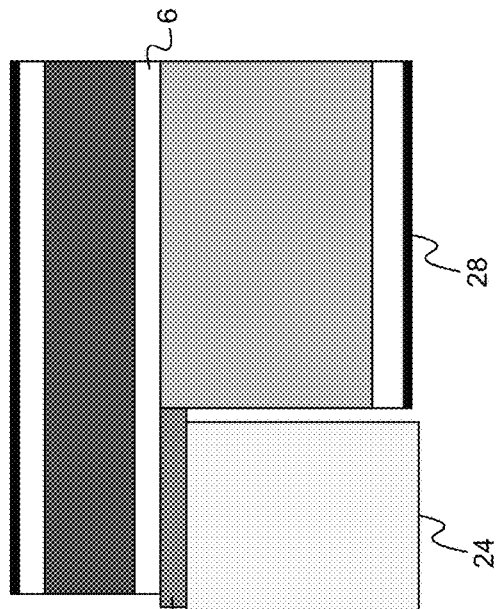

Embodiments of the present application are directed to a circuit board with embedded metal pallet. Those of ordinary skill in the art will realize that the following detailed description of a circuit board with embedded metal pallet is illustrative only and is not intended to be in any way limiting. Other embodiments of a circuit board with embedded metal pallet will readily suggest themselves to such skilled persons having the benefit of this disclosure.

Reference will now be made in detail to implementations of the circuit board with embedded metal pallet as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 5 illustrates a cut out side view of a circuit board with embedded metal pallet according to some embodiments. The circuit board is a laminated stack that includes one or more top layers 34, one or more bottom layers 38, and intervening non-conductive layer 46. The laminated stack also includes outer conductive layer 32 and outer conductive layer 40. The top layers 34 and the bottom layers 38 can each represent a single non-conductive layer, such as a dielectric, or a multi-layer stack made of one or more conductive layers and one or more non-conductive layers. The non-conductive layers can be made of prepreg or base material that is part of a core structure, or simply core. Prepreg is a fibrous reinforcement material impregnated or coated with a resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. The conductive layers are each electrically conductive layers made of a metal, such as copper, that is patterned into electrically conductive traces, or interconnects.

Device cutout 48 is formed in the front side of the laminated stack, through layers 32, 34, and 46. Device cutout 48 is sized to receive a heat generating component. Pallet cutout 50 is formed in the back side of the laminated stack, through layers 38 and 40. Pallet cutout 50 is sized to receive a metal pallet 52. In contrast to conventional circuit boards with embedded coins, the pallet cutout 50 is formed in the bottom layers 38 and 40 prior to a lamination step, as described in greater detail in relation to FIGS. 6-15. The metal pallet 52 is inserted into the pallet cutout 50 such that a top surface 54 of the metal pallet 52 contacts a bottom surface 56 of the non-conductive layer 46. The metal pallet 52 is inserted into the pallet cutout 50 prior to a lamination step. During the lamination step, the non-conductive layer 46 bonds with the metal pallet 52, securing the metal pallet 52 within the pallet cutout 50. In some embodiments, the non-conductive layer 46 is B-stage prepreg. During the lamination step, the non-conductive layer 46, as well as any non-conductive layers within the bottom layers 38, flows into any adjacent gaps between the metal pallet 52 and the bottom layers 38, represented as non-conductive layer 46 adjacent to the sides of the metal pallet 52. This material flow during lamination provides a contiguous bond between the sides of the metal pallet 52 and the bottom layers 38. Pressure and material flow during lamination also enables a planar back side surface, where a bottom surface of the metal pallet 52 is co-planar with a bottom surface of the outer conductive layer 40.

Figure 16:
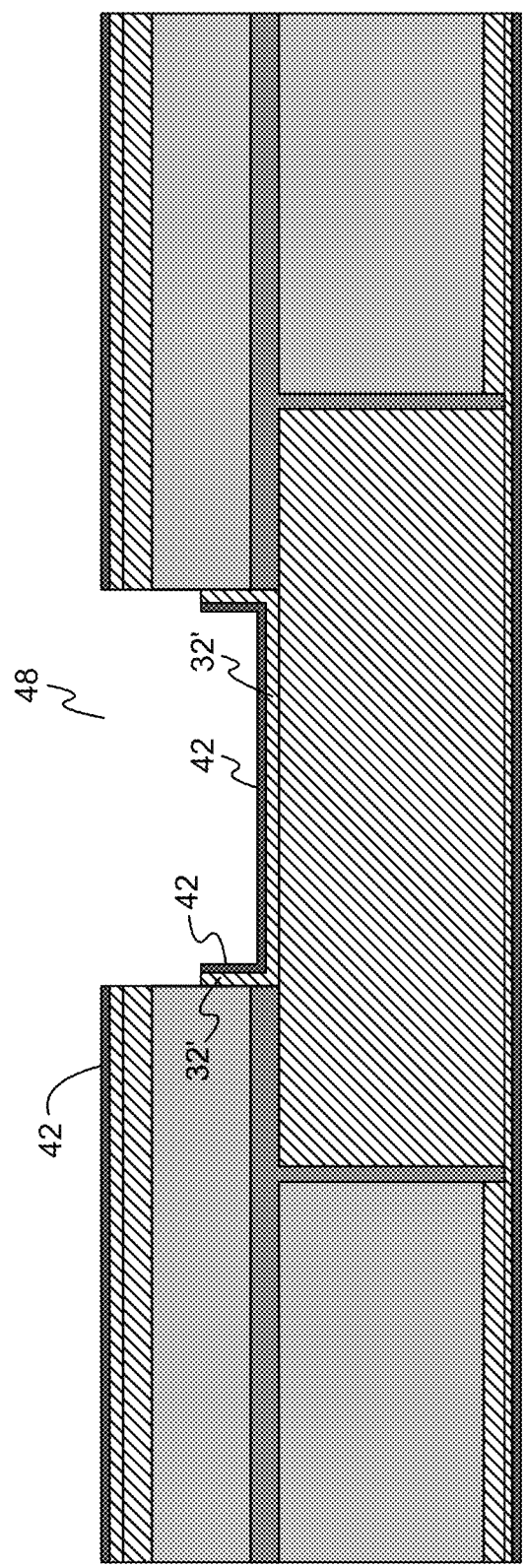
FIG. 16 illustrates a cut out side view of a circuit board with embedded metal pallet similar to that of FIG. 5 but with select portions of the device cutout side wall plating removed.

The outer conductive layers 32, 40 are often plated, such as with copper plating, and finish plated with an inert metal, such as gold, to prevent oxidation. The plating applied to outer conductive layer 32 is shown as plating 32', and the plating applied to the outer conductive layer 40 is shown as plating 40'. The finish plating applied over the plating 32' is shown as finish plating 42. The finish plating applied over the plating 40' is shown as finish plating 44. The plating and finish plating are applied as post-lamination steps, and therefore plating 32' is applied over the side wall surfaces of the device cutout 48 and over the top surface 54 of the metal pallet 52, and the finish plating 42 is also applied over the plating 32' within the device cutout 48. The side wall plating 32' within the device cutout 48 interconnects the metal pallet 52 with any conductive layers in the upper layers 34 that intersect the device cutout side wall surfaces. The side wall plating 32' within the device cutout 48 also interconnects the metal pallet 52 with the outer conductive layer 32. These interconnections provide additional thermal pathways from select conductive layers within the circuit board to the metal pallet 52. It is understood that certain conductive layers that intersect the device cutout side wall surfaces are not to be interconnected to the metal pallet, as such interconnection may result in undesired grounding or short-circuiting. In such applications, selective portions of the device cutout side wall plating 32' can be removed. FIG. 16 illustrates a cut out side view of a circuit board with embedded metal pallet similar to that of FIG. 5 but with select portions of the device cutout side wall plating removed. As shown in the exemplary configuration of FIG. 16, the upper portion of the side wall plating 32' is removed, along with the corresponding finish plating 42, thereby disconnecting the outer conductive layer 32 from the metal pallet 52.

Returning to FIG. 5, plating 40' provides an interconnection between the metal pallet 52 and the outer conductive layer 40. In some embodiments, the outer conductive layers and finish plating are etched after the lamination step. The outer conductive layers 32, 40 and finish plating 42, 44 shown in FIG. 5 are intended to represent etched interconnects. Vias (not shown) can be formed to interconnect one or more of the conductive layers. For simplicity, the top layers 34 and the bottom layers 38 are each shown in FIG. 5 as a simple block, but are each intended to represent one or more layers of the type described above. In other embodiments, the outer conductive layer 40 is a planar surface, such as a ground plane, and the interconnection with the metal pallet 52 provided by the plating 40' forms a heat spreader across the back side of the circuit board. Due to the planar alignment of the bottom surfaces of the metal pallet 52 and the back side of the laminated stack, the back side plating 40', and corresponding finish plating 44, form a planar surface highly conducive for efficient thermal transfer to a subsequently attached heat sink.

Fabrication Process:

FIGS. 6-15 illustrate a method of fabricating a circuit board with embedded metal pallet according to some embodiments. The method shown in FIGS. 6-15 is described in relation to the circuit board with embedded metal pallet of FIG. 5. It is understood that the same methodology can be applied to fabricate similar circuit boards with embedded metal pallets or that similar methodologies can be used to fabricate the same or similar circuit board with embedded metal pallet as that shown in FIG. 5. In FIG. 6, appropriate layers are stacked to form the top layers 34 and conductive layer 32, collectively referred to as top section stack-up. The top layers 34 can represent a single non-conductive layer, such as a dielectric, or a multi-layer stack made of one or more conductive layers and one or more non-conductive layers. The non-conductive layers can be made of prepreg or base material that is part of a core structure. The conductive layers within the top layers 34 are each electrically conductive layers made of a metal, such as copper, that are patterned into electrically conductive traces, or interconnects. The bottom-most layer of the top layers 34 can be a non-conductive layer or a conductive layer. In the exemplary configuration shown in FIG. 6, the bottom-most layer is a conductive layer, represented as a conductive layer 31. In an exemplary application, the layers 31, 32, 34 are a core made of a metal clad PCB material.

In FIG. 7, a first portion cutout 48' of the device cutout 48 is formed in the back side of the top section stack-up from FIG. 6. In some embodiments, the first portion cutout 48' is formed by milling. It is understood that other conventional techniques can be used, such as laser ablation. A size of the first portion cutout 48' is application specific, dependant on the dimensions of a heat generating device to be placed in the device cutout 48.

In FIG. 8, additional layers with appropriate cutouts are added to the stack-up. In particular, the non-conductive layer 46 is stacked with the top section stack-up of FIG. 7 such that the non-conductive layer 46 contacts the back side of the top section stack-up, which in this exemplary case is the conductive layer 31. The non-conductive layer 46 includes a second portion cutout 48" that matches the dimensions of the first portion cutout 48'. In some embodiments, the second portion cutout 48" is formed in the non-conductive layer 46 prior to stack-up. In this case, the non-conductive layer 46 is stacked with the top section stack-up such that the first portion cutout 48' and the second portion cutout 48" are aligned. In other embodiments, the non-conductive layer 46 can be stacked with the top section stack-up of FIG. 6, and the first and second section cutouts 48' and 48" are made simultaneously. After the non-conductive layer 46 with second section cutout 48" is stacked with the top section stack-up, appropriate layers are stacked to form the bottom layers 38 and conductive layer 40, collectively referred to a bottom section stack-up. The bottom layers 38 can represent a single non-conductive layer, such as a dielectric, or a multi-layer stack made of one or more conductive layers and one or more non-conductive layers. The non-conductive layers can be made of prepreg or base material that is part of a core structure. The conductive layers within the bottom layers 38 are each electrically conductive layers made of a metal, such as copper, that are patterned into electrically conductive traces, or interconnects. In the exemplary configuration shown in FIG. 8, each core material layer represents a base material and a conductive layer on one or both surfaces of the base material. It is understood that more or less cores and non-conductive layers than that shown in the figures can be used. The stack-up shown in FIG. 8 is pre-lamination (pre-curing).

Each of the bottom layers 38 and conductive layer 40 includes a cutout, which are all aligned to collectively form the pallet cutout 50. A size and shape of the cutouts in each bottom layer 38 and conductive layer 40 is configured to substantially match that of the metal pallet 52 and enable the metal pallet 52 to be inserted into the pallet cutout 50. In some embodiments, the cutout is formed in each separate stack-up layer or core prior to stack-up. In this case, the separate stack-up layers are stacked with corresponding cutouts aligned. In other embodiments, the cutout are not formed in the bottom layers 38 and conductive layer 40 prior to stack-up. Instead, the separate stack-up layers are stacked with the top section stack-up and non-conductive layer 46, and the pallet cutout 50 is made through all appropriate layers simultaneously. At least a length or width of the pallet cutout 50 is larger than a corresponding length or width of the device cutout 48 so that a portion of the non-conductive layer 46 is exposed within the pallet cutout 50. This exposed portion of the non-conductive layer 46 forms a bonding surface for the metal pallet 52. This exposed portion of the non-conductive layer 46 also functions as a stop for maintaining a relative position of the metal pallet 52 within the stack-up during a subsequent lamination step.

In FIG. 9, the metal pallet 52 is inserted into the pallet cutout 50 such that the surface 54 of the metal pallet 52 contacts the exposed surface 56 of the non-conductive layer 46. The contacting surface of the non-conductive layer 46 functions as the bonding agent. A separate adhesive layer is not used as in the prior art. Having to use a separate adhesive requires an additional process step.

In FIG. 10, the stack-up is laminated. During lamination, resin in the non-conductive layers not fully cured, such as those layers labeled "prepreg" in FIG. 10, flows to form a bond between the surface 54 of the metal pallet 52 and the surface 56 of the non-conductive layer 46. Resin of the non-conductive layers also flows between the sides of the metal pallet 52 and the lateral layers of the stack-up adjacent the metal pallet 52. This material flow during lamination provides a contiguous bond between the sides of the metal pallet 52 and the bottom layers 38. Pressure and material flow during lamination also enables a planar back side surface, where a bottom surface of the metal pallet 52 is co-planar with a bottom surface of the outer conductive layer 40. Special techniques are used to prevent resin from flowing into the device cutout sections 48', 48'' during the lamination process. Some techniques incorporate a photo imageable polymer structure or plating resist layer within the top layers 34 and non-conductive layer 46 to prevent resin flow into the device cutout sections. Examples of such techniques are found in U.S. patent application Ser. No. 15/081,623 and entitled "Self-Decap Cavity Fabrication Process and Structure", U.S. patent application Ser. No. 15/087,793 and entitled "Embedded Cavity in Printed Circuit Board by Solder Mask Dam", U.S. patent application Ser. No. 15/159,665 and entitled "Disconnect Cavity by Plating Resist Process and Structure", and U.S. patent application Ser. No. 15/094,372 and entitled "Recessed Cavity in Printed Circuit Board Protected by LPI", which are each hereby incorporated by reference in their entireties. Another technique is to not form the device cutout section prior to lamination and instead use a coverlay and dummy core positioned within the top layers 34 and non-conductive layer 46, which are subsequently removed along with remaining cap structure above the metal pallet 52 to form the device cutout 48. An example of such a technique is found in U.S. patent application Ser. No. 15/064,437 and entitled "Dummy Core Restrict Resin Process and Structure", which is hereby incorporated by reference in its entirety. Yet another technique is to use a no-flow prepreg as the non-conductive layer 46.

Figure 11:
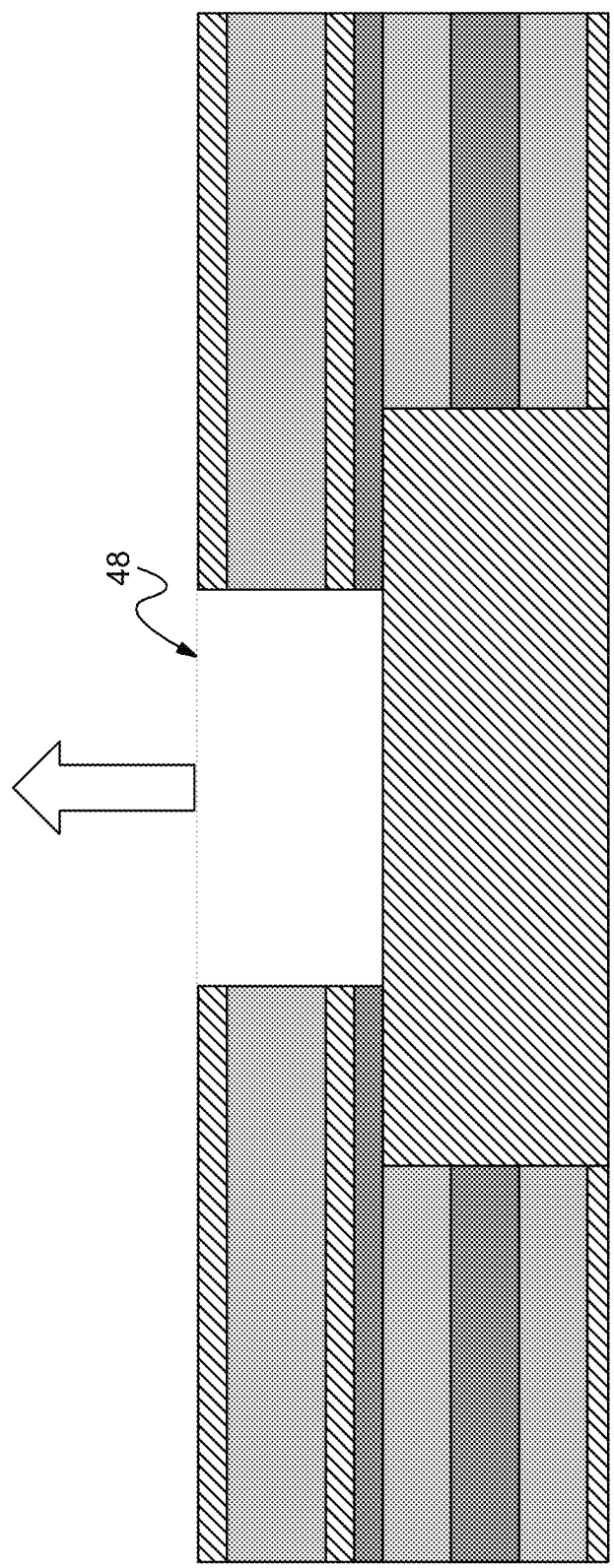

In FIG. 11, the portion of the top section stack-up above the device cutout sections 48' is removed to form the device cutout 48. The device cutout 48 is a cavity extending from the top surface of the laminated stack-up to the surface 54 of the metal pallet 52. The portion can be removed using any conventional technique including, but not limited to, milling and laser ablation. The depth of the device cutout 48 is design specific according to the electronic device that is to be positioned within the device cutout 48. The depth of the device cutout 48 is a function of the thicknesses of the various layers in the top layers 34 and the non-conductive layer 46. The thickness of each layer and/or the number of layers can be chosen to achieve a desired device cutout depth.

Figure 12:
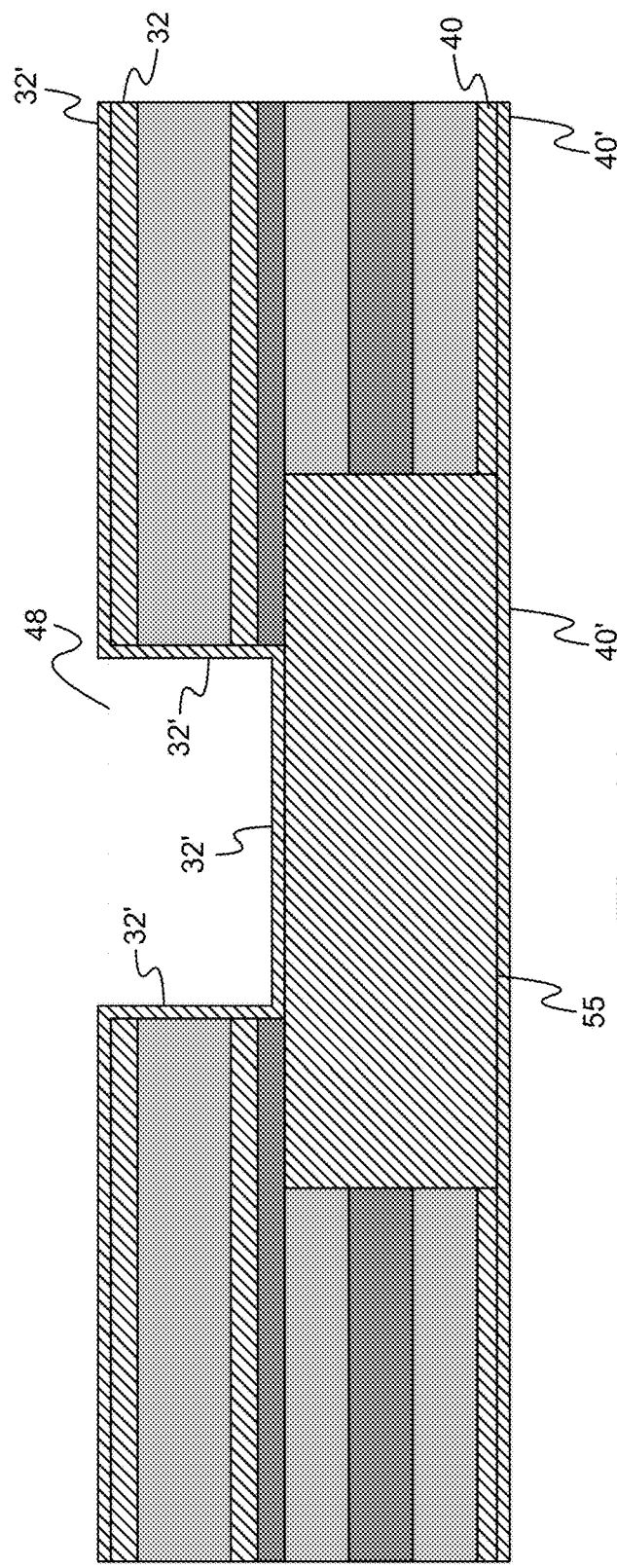

In FIG. 12, a plating step is performed. Plating is applied to the top and bottom surfaces of the laminated stack in FIG. 11. Specifically, plating 32' is applied over the conductive layer 32. Plating 32' is also applied onto the side wall surfaces of the device cutout 48 and the exposed portion of metal pallet surface 54 in the device cutout 48. The side wall plating 32' within the device cutout 48 interconnects the metal pallet 52 with any conductive layers in the upper layers 34 that intersect the device cutout side wall surfaces. The side wall plating 32' within the device cutout 48 also interconnects the metal pallet 52 with the outer conductive layer 32. These plated interconnections provide additional thermal pathways from select conductive layers within the circuit board to the metal pallet 52. It is understood that certain conductive layers that intersect the device cutout side wall surfaces are not to be interconnected to the metal pallet, as such interconnection may result in undesired grounding or short-circuiting. In such applications, selective portions of the device cutout side wall plating 32' can removed, such as shown in FIG. 16. In some applications, it is desirable to connect the embedded metal pallet to a ground plane, such as the conductive layer 31. In such applications, the side wall plating does not extend to active signal layers, such as the top surface conductive layer 32. The side wall plating can be selectively removed. In prior art structures, the embedded coin is attached directly to a conductive layer, such as a ground plane conductive layer, via the conductive adhesive.

Plating 40' is applied over the conductive layer 40 and the back side metal pallet surface 55. The bottom surface plating 40' provides a connection between the metal pallet 52 and the bottom surface conductive layer 40, and spreads the heat from the copper pallet along a bottom surface of the laminated stack. The plating layer formed on the bottom of the laminated stack is substantially planar across the entire bottom surface with little to no demarcation from the metal pallet to the circuit board along the bottom surface. In prior art structures and processes, a coin cutout is formed after lamination, and the metal coin is secured in the cutout coin using a conductive adhesive, which makes it extremely difficult to have the bottom of the metal coin co-planar with a bottom of the laminated stack. However, in the current application, the pallet cutout is formed and the metal pallet is inserted into the pallet cutout prior to lamination, and the metal pallet is bonded directly to the non-conductive layer (prepreg). During lamination, conformal filing is provided around the metal pallet by resin flow, and the applied pressure during lamination results in the bottom surface of the metal pallet being substantially co-planar with the circuit board outer layer. The pallet cutout depth is being controlled by the lamination press out, and because the metal pallet is embedded in the stack-up pre-lamination and the manner by which the prepreg flows and compresses during lamination, the materials surrounding the embedded metal pallet conform to the shape of the metal pallet, including its thickness, to achieve a substantially co-planar back side surface. The conformal filling also enables micro-spaces adjacent to the metal pallet to be filled which provides a back side surface that can be plated without concern of voids or gaps adjacent to the perimeter of the metal pallet.

Figure 13:
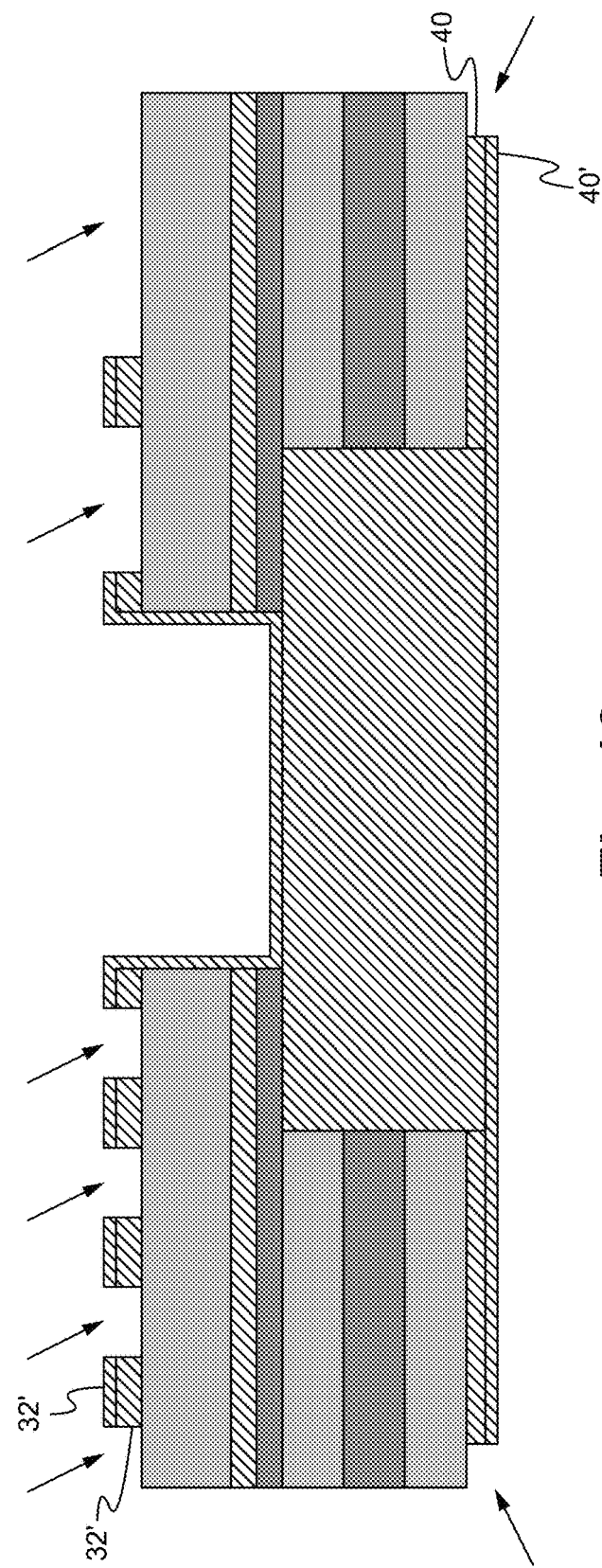

In FIG. 13, an outer layer etching step is performed. Outer layer etching can be performed on the outer conductive player 32/32', the outer conductive layer 40/40', or both.

Figure 14:
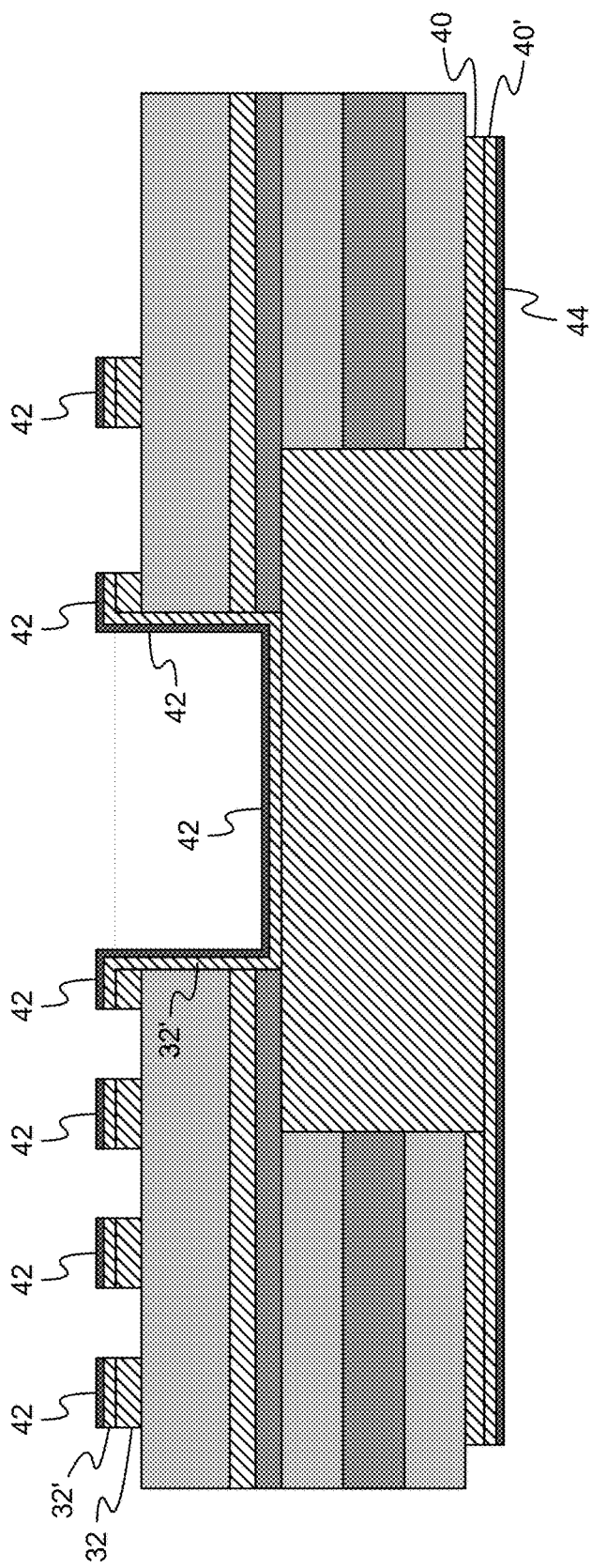

In FIG. 14, a finish plating step is performed. Finish plating can be applied over all exposed plating to prevent oxidation. The finish plating material is an inert metal, such as gold, silver, tin, nickel, or some combination, or some other inert metal or inert metal combination. As applied to FIG. 14, finish plating 42 is applied to the outer exposed plating 32', which includes the front side plating 32' surfaces of the circuit board, as well as the side wall plated surfaces and the plated surface of the metal pallet 52 within the device cutout 48. It is understood that plating and finish plating steps, such as those described in ration to FIGS. 13 and 14, can be performed using one or more conventional plating and finish plating techniques, in either a panel plate process or in a pattern plate process, to achieve the desired overall plating thickness. Some finish platings can be applied electrolytically and are applied after the plating step but before etching. Other finishes can be applied after solder mask is applied to selective location using this process. Such finishes are considered immersion or electroless finishes, which also can be applied to the entire circuit board surface after etching if desired.

Figure 15:
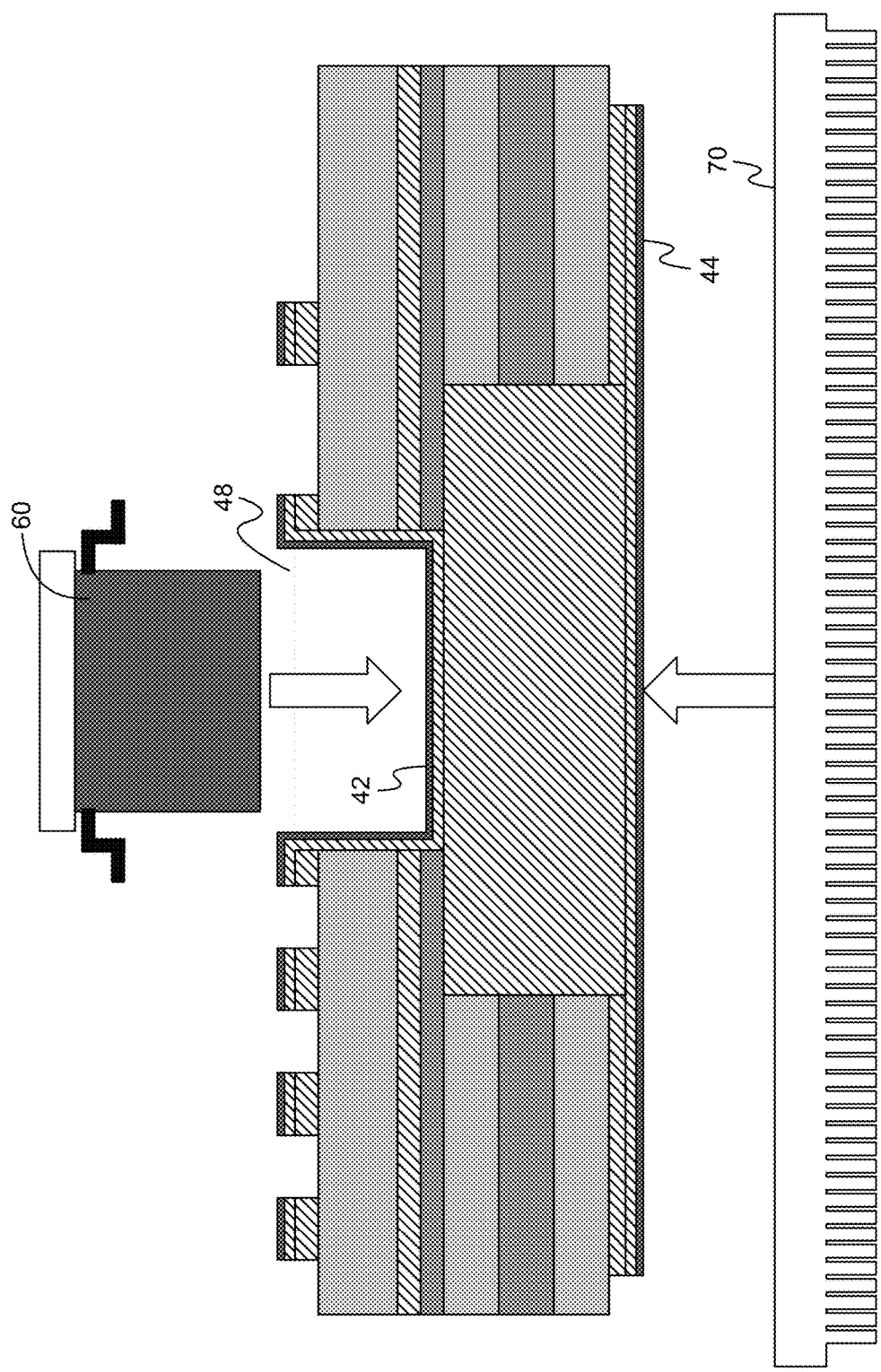
Figure 17:
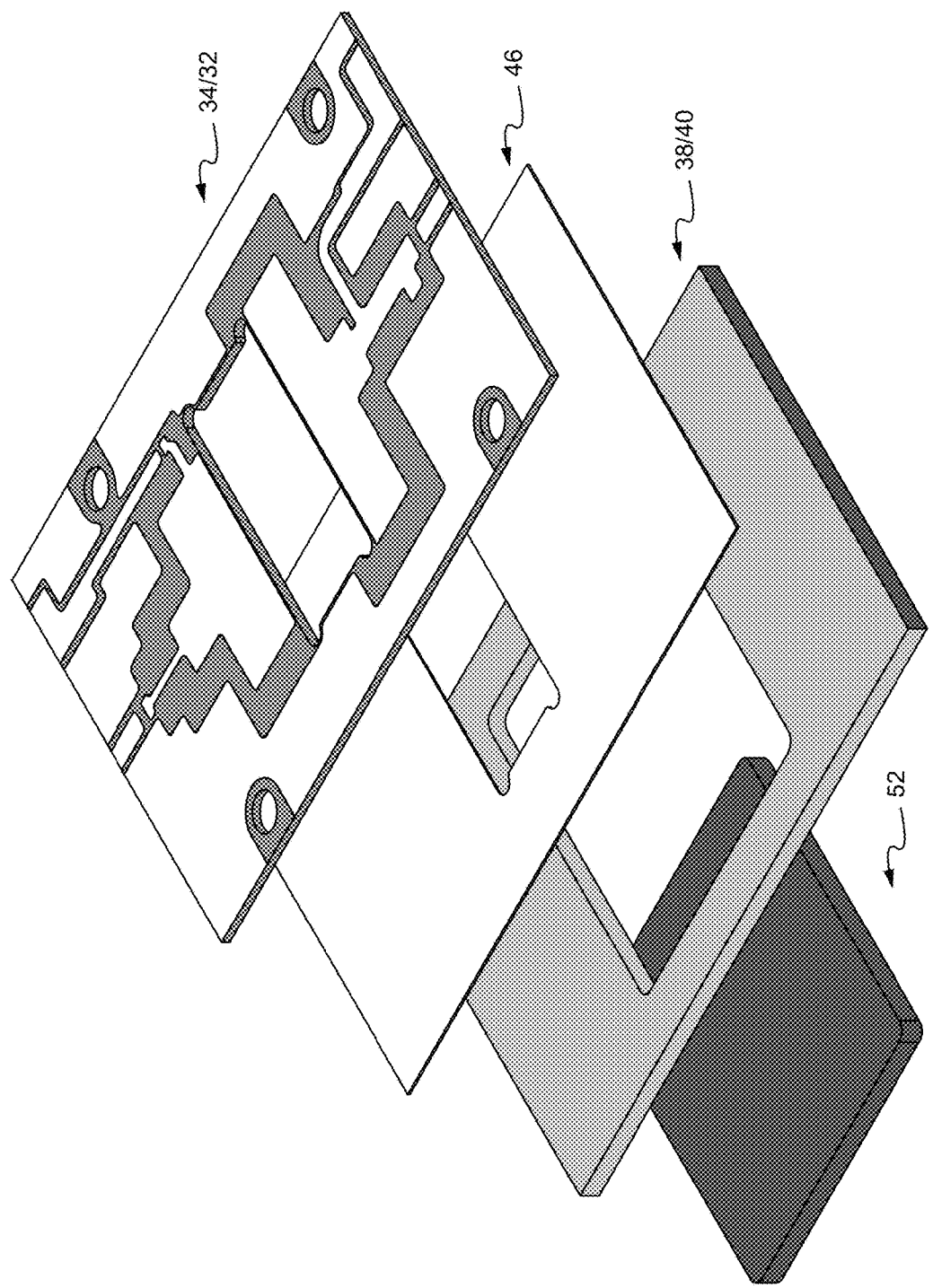
FIG. 17 illustrates a top down view of the circuit board with embedded metal pallet exploded into sections.

In FIG. 15, an electronic device 60 is mounted in the device cutout 48 using a conductive adhesive. Because of the co-planar surface already present on the back side of the circuit board, the adhesive can be applied with a substantially uniform thickness across the entire backside surface. A heat sink 70 is mounted to the back side of the circuit board. Any conventional mounting techniques for mounting a heat sink to a circuit board can be used including, but not limited to, adhesive, paste, solder, compression, and/or mechanical means such as screwing the heat sink to the circuit board FIG. 17 illustrates a top down view of the circuit board with embedded metal pallet exploded into sections. The exploded sections can include the outer conductive layer 32/upper layers 34, the non-conductive layer 46, the bottom layers 38/outer conductive layer 40, and the metal pallet 52. The outer conductive layer 32/upper layers 34 and the non-conductive layer 46 is shown with the device cutouts. The bottom layers 38/outer conductive layer 40 is shown with the pallet cutout.

Figure 18:
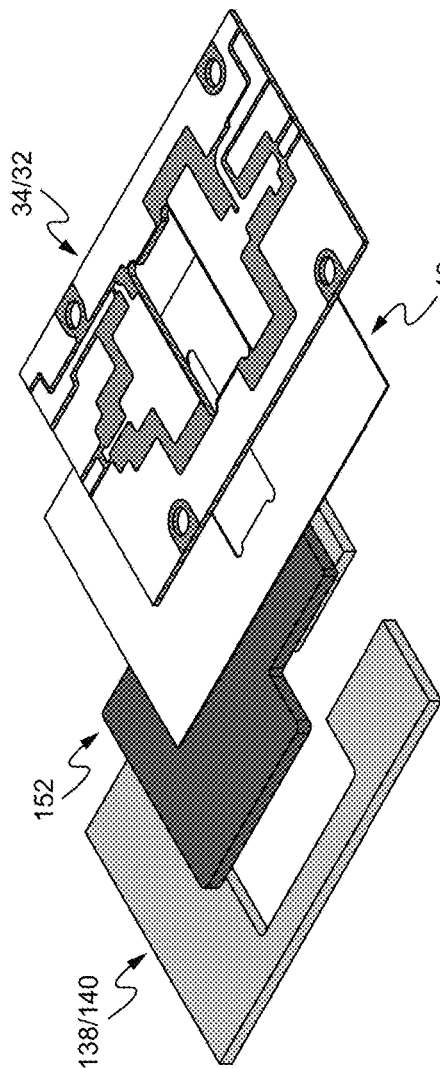
FIG. 18 illustrates a top down view of the circuit board with embedded metal pallet exploded into sections according to an alternative configuration.
Figure 19:
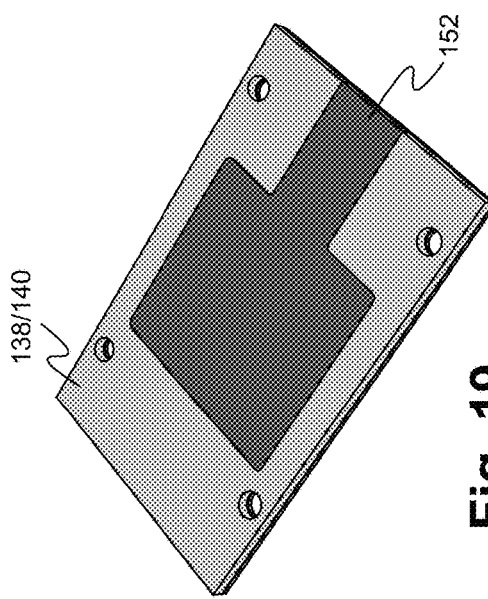
FIG. 19 illustrates the metal pallet fitted into the pallet cutout of the bottom layers/outer conductive layer.

It is understood that the metal pallet can be of any size and shape based on the application design. Preferably the metal pallet is positioned at the hot spots on the circuit board, such as underneath heat generating components. FIG. 18 illustrates a top down view of the circuit board with embedded metal pallet exploded into sections according to an alternative configuration. In this alternate configuration, the metal pallet is shaped differently than previous embodiments, and the corresponding pallet cutout is re-shaped accordingly. The exploded sections can include the same outer conductive layer 32/upper layers 34 and the non-conductive layer 46. However, the metal pallet 152 has a different shape than the metal pallet 52, and the bottom layers 138/outer conductive layer 140 have a differently shaped pallet cutout to match the shape of the metal pallet 152. FIG. 19 illustrates the metal pallet 152 fitted into the pallet cutout of the bottom layers 138/outer conductive layer 140.

Figure 20:
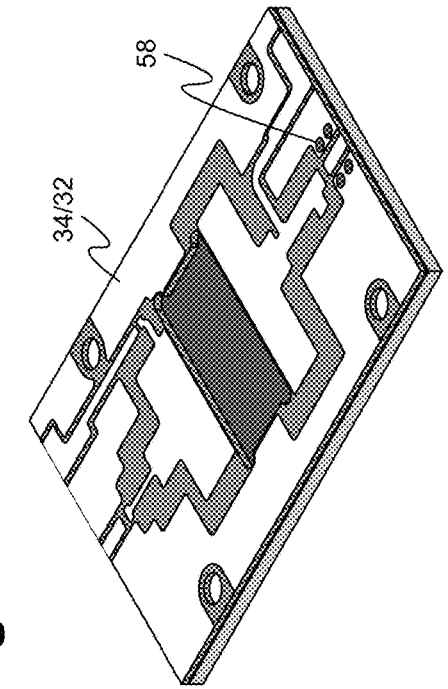
FIG. 20 illustrates a top down perspective view of the circuit board with embedded metal pallet of FIGS. 18 and 19 having via access to the underlying metal pallet.

Post-lamination processes can be performed where plated through hole vias can be drilled through the circuit board including the metal pallet, or plated blind vias can be formed that extend from the circuit board front side to the metal pallet, either or both can be used to add additional thermal conduction paths, but can also reduce parasitic inductance. FIG. 20 illustrates a top down perspective view of the circuit board with embedded metal pallet of FIGS. 18 and 19 having via access to the underlying metal pallet. Plated vias 58 are formed through the front side of the circuit board to the underlying metal pallet 152 (FIG. 19). In an exemplary process, such plated vias can be formed during the plating step in FIG. 12.

In some embodiments, more than one metal pallet can be embedded in a circuit board using these processes and techniques. The size, shape, and number of metal pallets is a function of how much heat needs to be pulled away from the heat generating component(s) and the positions of the heat generating components on the circuit board.

In some applications, the circuit board with embedded metal pallet is used as a power amplifier board. It is understood that the concepts, structures, and fabrication methods described herein can be alternatively applied to other types of circuit boards and for other types of applications.

The circuit board with embedded metal pallet provides a number of distinct features. The circuit board is completely fabricated with the metal pallet embedded. The pallet cutout is formed during the fabrication process prior to lamination, and as such no separate metal pallet attachment processing is required. Standard B-stage (prepreg) material can be used to bond the metal pallet into the circuit board during the lamination process. Process to control internal cutout resin flow is used to prevent excessive bleed of B-Stage into the device cutout area. In addition, B-stage material flows into areas around the metal pallet, which increases structural integrity. The metal pallet is plated to create a uniform bottom surface, and the metal pallet is interconnected to the plated surface at the back side of the circuit board. Other layers above the metal pallet can be connected electrically and thermally into the metal pallet via side wall plating in the device cutout and various via formations, if desired. Grounding can be achieved by using the device cutout side wall plating, as well as forming plated vias through the circuit board upper layers to the metal pallet. The plated vias can also be used to further enhance the dissipation of heat from circuits absorbing heat due to high power requirements.

The metal pallet is integrated in the circuit board using a process similar to a multilayer PCB, which integrates the metal pallet into the circuit board at the same time as the supporting layers are fabricated. The use of B-stage material provides a bonding mechanism for the metal pallet to be embedded within the circuit board, creating a cohesive integrated part. Embedding the pallet during the fabrication process, pre-lamination, generates a more robust construction and connection not impacted by post fabrication process in assembly. After assembly the circuit board with embedded metal pallet can be directly mounted to a heat dissipating location within the mechanical design. The circuit board with embedded metal pallet also can be mounted directly on a heat sink, cool ribbon, or other feature required to help remove heat. The planar back side surface provides a more robust mounting of the metal pallet than a post fabricated assembly of the prior art. This solution will allow standard assembly processes for component placement and further mechanical requirement. This keeps a more standard process flow through assembly, reducing cost and handling.

The present invention has been described in terms of specific embodiments incorporating details to facilitate the understanding of the principles of construction and operation of the circuit board with embedded metal pallet. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A circuit board comprising:
a laminated stack of circuit board layers having a first outer surface and a second outer surface opposite the first outer surface, wherein the laminated stack of circuit board layers comprises a plurality of conductive layers layer and a plurality of non-conductive layers, one of the plurality of non-conductive layers is a prepreg bonding layer within an interior of the laminated stack, the prepreg bonding layer having a first surface and a second surface opposite the first surface;
a pallet cutout formed in the laminated stack from the second outer surface to the second surface of the prepreg bonding layer, the pallet cutout defined by side wall surfaces and the second surface of the prepreg bonding layer;
a metal pallet positioned within the pallet cutout, the metal pallet having a first surface and a second surface opposite the first surface, wherein the first surface of the metal pallet is in contact with and is bonded to the second surface of the prepreg bonding layer; and
a device cutout formed in the laminated stack from the first outer surface through the prepreg bonding layer to the first surface of the metal pallet;
wherein the second outer surface of the laminated stack and the second surface of the metal pallet are co-planar to form a planar back side surface of the circuit board.

2. The circuit board of claim 1 wherein the prepreg bonding layer comprises B-stage prepreg.

3. The circuit board of claim 1 wherein the pallet cutout is formed in a first portion of the laminated stack, and the first portion of the laminated stack comprises one or more prepreg layers, further wherein the metal pallet further comprises side surfaces and the side wall surfaces of the metal pallet are defined by the first portion of the laminated stack, and the side surfaces of the metal pallet are bonded to the side wall surfaces of the pallet cutout by resin flow from the one or more prepreg layers.

4. The method of claim 1 further comprising a plating layer coupled to the back side surface of the circuit board to form a continuous planar surface across the back side of the circuit board that is interconnected to the metal pallet.

5. The circuit board of claim 1 wherein the device cutout is sized to receive a heat generating device.

6. The circuit board of claim 1 further comprising a plating layer selectively coupled to the first outer surface of the laminated stack, wherein the plating layer is further coupled to side wall surfaces of the device cutout and the first surface of the metal pallet.

7. The circuit board of claim 2 wherein the pallet cutout is formed in a first portion of the laminated stack, further wherein the metal pallet further comprises side surfaces and the side wall surfaces of the pallet cutout are defined by the first portion of the laminated stack, and the side surfaces of the metal pallet are bonded to the side wall surfaces of the pallet cutout by resin flow from the B-stage prepreg.

8. The circuit board of claim 6 wherein the plating layer forms an interconnect between the metal pallet and any conductive layers in the laminated stack that intersect the side wall surfaces of the device cutout.

9. The circuit board of claim 6 wherein a portion of the plating on the side wall surfaces of the device cutout are selectively removed such that a remaining portion of the plating on the side wall surfaces of the device cutout forms an interconnect between the metal pallet and any conductive layers in the laminated stack that intersect the side wall surfaces of the device cutout coincident with the remaining portion of the plating.

10. A method of fabricating a circuit board with an embedded metal pallet, the method comprising:
stacking layers of a circuit board, wherein the layers comprise a plurality of
conductive layers layer and a plurality of non-conductive layers, wherein one of the plurality of non-conductive layers is a prepreg bonding layer within an interior of the stacked layers, further wherein a first portion of the stacked layers has a pallet cutout section, the pallet cutout section of each layer in the first portion are aligned to form a pallet cutout for receiving a metal pallet, further wherein the prepreg bonding layer forms a bottom surface of the pallet cutout;
inserting the metal pallet into the pallet cutout such that a first surface of the metal pallet contacts the prepreg bonding layer; and
laminating the stacked layers with inserted metal pallet to form a laminated stack and to bond the metal pallet to the prepreg bonding layer;
removing a second portion of the laminated stacked layers stacked over the metal pallet after laminating the stacked layers to form a device cutout that extends from a front side of the circuit board to the metal pallet, wherein the first surface of the metal pallet forms a bottom surface of the device cutout;
wherein laminating the stacked layers comprises compressing the stacked layers and the inserted metal pallet to form a planar back side surface of the circuit board where a bottom surface of the metal pallet is co-planar with a back side surface of the stacked layers.

11. The method of claim 10 wherein the prepreg bonding layer comprises B-stage prepreg.

12. The method of claim 10 wherein laminating the stacked layers comprises applying heat and pressure to the stacked layers such that resin flows around sides of the metal pallet to bond the sides of the metal pallet to the first portion of the stacked layers.

13. The method of claim 10 wherein the device cutout is sized to receive a heat generating device.

14. The method of claim 10 further comprising plating the front side of the circuit board which includes plating side wall surfaces of the device cutout and the first surface of the metal pallet exposed within the device cavity.

15. The method of claim 10 wherein plating the side wall surfaces of the device cutout forms an interconnect between the metal pallet and any conductive layers intersecting the side wall surfaces of the device cutout.

16. The method of claim 10 further comprising plating the back side of the circuit board to form a continuous planar surface across the back side of the circuit board that is interconnected to the metal pallet.

17. The method of claim 15 further comprising selectively removing a portion of the side wall plating on the side wall surfaces of the device cutout to selectively disconnect one or more of the conductive layers intersecting the side wall surfaces of the device cutout from the metal pallet.

* * * * *

UNITED STATES PATENT AND TRADEMARK OFFICE
CERTIFICATE OF CORRECTION

PATENT NO. : 10,499,500 B2
APPLICATION NO. : 15/803527
DATED : December 3, 2019
INVENTOR(S) : J H Berkel et al.

Page 1 of 1

It is certified that error appears in the above-identified patent and that said Letters Patent is hereby corrected as shown below:

In the Claims

Column 13, Line 12, please delete "layer"

Column 14, Line 13, please delete "layer"

Signed and Sealed this
Twenty-fourth Day of November, 2020

Andrei Iancu
*Director of the United States Patent and Trademark Office*